United States Patent [19]

de Pauw

[11] Patent Number: 4,721,953

[45] Date of Patent: Jan. 26, 1988

[54] REMOTE CONTROL SYSTEM

[75] Inventor: Jurianus de Pauw, Emmen, Netherlands

[73] Assignee: Ericsson Paging Systems B.V., Emmen, Netherlands

[21] Appl. No.: 820,618

[22] Filed: Jan. 21, 1986

[30] Foreign Application Priority Data

Jan. 25, 1985 [NL] Netherlands ........................ 8500203

[51] Int. Cl.[4] ...................... G05B 23/02; G08C 19/00; H03K 19/23

[52] U.S. Cl. .......................... 340/825.17; 340/825.06; 340/825.77; 307/464

[58] Field of Search ...................... 340/825.17, 825.06, 340/825.19, 825.57, 825.63, 825.77, 825.78; 307/463, 464; 328/119

[56] References Cited

U.S. PATENT DOCUMENTS

| | | | |
|---|---|---|---|
| 3,702,473 | 11/1972 | Fink | 340/825.78 |
| 3,708,784 | 1/1973 | Spencer | 340/825.17 |
| 3,932,714 | 1/1976 | Guimier et al. | 340/825.77 |
| 4,017,832 | 4/1977 | Gilbert | 340/825.17 |
| 4,086,570 | 4/1978 | Wakasa et al. | 340/825.77 |
| 4,136,333 | 1/1979 | Sumida et al. | 340/825.17 |
| 4,427,904 | 1/1984 | Imazeki et al. | 307/463 |
| 4,575,718 | 3/1986 | Ludowyk | 340/825.17 |
| 4,580,138 | 4/1986 | Morrison | 340/825.78 |

FOREIGN PATENT DOCUMENTS 58-10992 7/1983 Japan .

*Primary Examiner*—Ulysses Weldon
*Assistant Examiner*—Ralph E. Smith
*Attorney, Agent, or Firm*—Burns, Doane, Swecker & Mathis

[57] ABSTRACT

Remote-control system comprising a main unit and, connected at a distance via a pair of conductors to the main unit, an operating unit which comprises a series circuit of a number of diodes connected between the conductors of the conductor pair, a number of switches connected parallel to one or more of the diodes, and a signalling circuit. The main unit provides signalling corresponding to the certain current. In particular the certain current is determined by the state of the switches.

9 Claims, 7 Drawing Figures

REMOTE CONTROL SYSTEM

BACKGROUND OF THE INVENTION

The invention relates to a remote-control system comprising a main unit and, connected at a distance via a pair of conductors to the main unit, an operating unit which is provided with a series circuit of a number of diodes connected between the conductors and a number of switches which are connected parallel to a group of one or more diodes, the main unit being provided with a supply circuit connected to the conductors and a voltage detection circuit connected to the conductor in a manner such that the voltage detection circuit delivers a detection signal which is dependent on the state of the switches.

A remote-control system of this type is known from the U.S. Pat. No. 4,427,904. In the known system the supply source consists of a voltage source which is connected in series with a resistor to the conductor pair. The resistor serves as a current limiting resistor and to separate the voltage source, with constant output voltage, from the conductor connected to the resistor so that a voltage can appear on the said conductor which is dependent on the state of the switches.

The known system has the drawback that the user of the operating unit receives no information on the correct detection of the position of the switches of the said operating unit and also cannot receive any other messages from the main unit via the conductor pair. This constitutes in particular a disadvantage on using the system in a hospital where a number of operating units are allowed to patients, it being desired that a patient receives a confirmation from his operating unit that the state of the switches has been detected.

The object of the invention is to remove the disadvantage of the known system.

SUMMARY OF THE INVENTION

The intended object is achieved in that, according to the invention, the supply circuit consists of a current source circuit which delivers to the conductor pair a current which is determined by a control signal delivered to a control input by a control circuit and that a signalling circuit is connected to the series circuit of the diodes, the signalling circuit providing signalling which is dependent on the current through the series circuit.

The main unit may be equipped to select the intensity of the current through the conductor pair depending on the detected position of the switches of the operating unit.

The main unit may, however, also be equipped to select the current intensity as a function of conditions generated outside the system so that various message can be transmitted to the operating unit.

The current source circuit and the signalling circuit may be equipped to deliver or detect respectively a current with an arbitrary number of select values. When being used in, for example, a hospital, it is, however, sufficient that the current can have two different values and that the signalling circuit provides binary signalling corresponding thereto.

If the conductor pair is short-circuited, the voltage across them will be OV. in the event of rupture of the conductor pair, the voltage across the conductors at the voltage detection circuit will be equal to the maximum possible voltage across the conductors, usually the supply voltage of the system. By a suitable construction of the voltage detector these two fault conditions of the system can therefore be detected because the signalling circuit of the operating unit can also be equipped for signalling these two fault conditions.

It is noted that from the U.S. Pat. No. 3,708,784 a system is known in which a control circuits for, for example, an energising device of an aeroplane connected at a distance to an operating unit which is provided with the switch and a conductor between the operating unit and the main unit. When the switch of the operating unit is opened no current flows through the connection to the main unit so that this condition is comparable with the fault condition in which this connection is broken. The operating unit is provided with an additional circuit which receives a control signal from an external source and which can feed an additional current via an isolating diode through the signalling circuit. Dependent on the current intensity through the signalling circuit, the signalling circuit will be able to provide signalling. However, since the signalling is ambiguous, this known system can not properly be used in the field of emergency signalling. In addition no voltage detection takes place at an arbitrary number of levels, and the operation of the signalling circuit is not dependent on the state of the single switch, so that the application at the known system is very limited.

From the Japanese Patent Application No. JP 58-10992 a remote-control system is known in which a main unit is connected at a distance to an operating unit via three conductors. In the operating unit a number of parallel branches are connected between two of the conductors of the connection to the main unit, each branch consisting of a series circuit of a switch and a current source. On energising a switch the current source connected thereto will deliver a current to the main unit. The main unit detects the current delivered by the operating unit and delivers a return signal corresponding thereto to a signalling circuit of the operating unit. The return signal can, however, only be delivered to the operating unit if all the switches of the operating unit are opened.

DETAILED DESCRIPTION OF PREFERRED EMBODIMENTS

Figure 1:
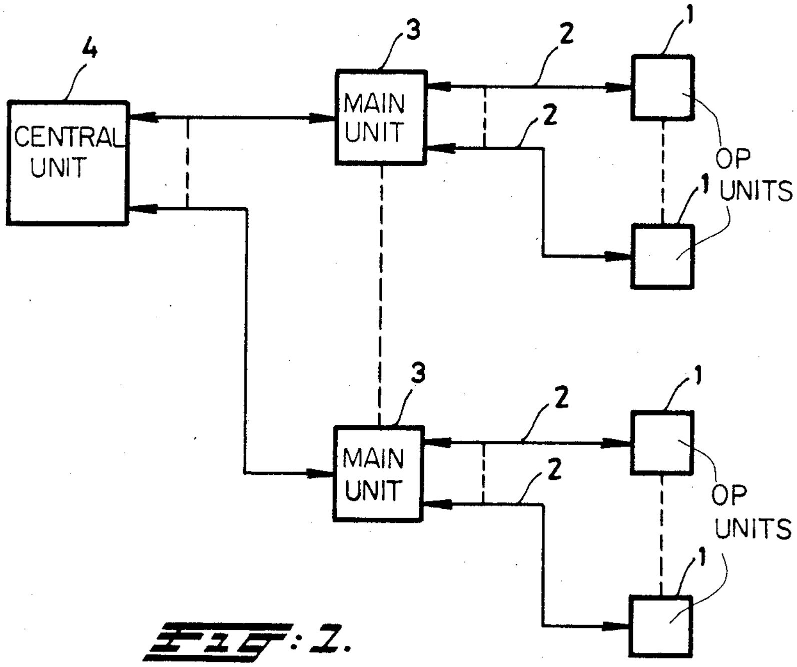
FIG. 1 shows a block diagram of a remote-control system in which the invention is used.

The block diagram shown in FIG. 1 of a remote-control system according to the invention comprises a number of operating units 1, which is each connected via a conductor pair 2 to a main unit 3. Each main unit 3 may independently process the instructions received from an operating unit 1, or as shown in FIG. 1, in conjunction with a central unit 4 connected to a number of main units 3. The central unit 4 may be a call station for the radiographic transmission of messages to paging receivers. A system as shown in FIG. 1 is very suitable for use in hospitals.

Figure 2:
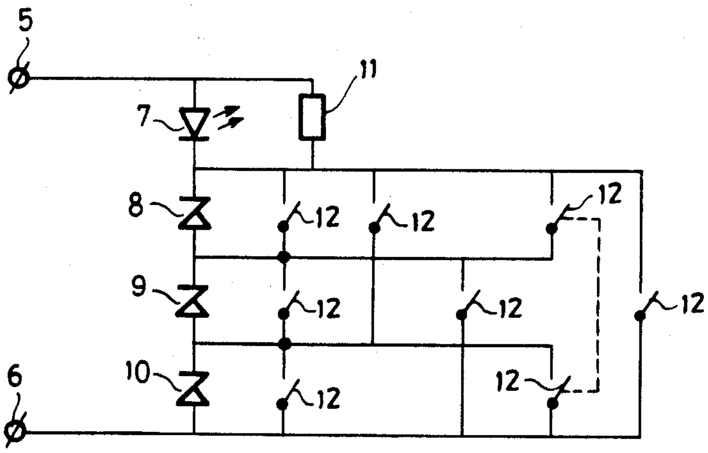
FIG. 2 shows a diagram of an embodiment of an operating unit of FIG. 1.

FIG. 2 shows an embodiment of an operating unit 1. The operating unit 1 has two connection terminals 5, 6 to which the conductor pair 2 to be connected to the main unit 3 is connected. Between the connecting terminals 5 and 6 there is connected a series circuit of a number of diodes 7, 8, 9, 10. The diode 7 is a light-emitting diode across which a resistor 11 is connected in parallel.

The diodes 8, 9 and 10 are zener diodes. Parallel to each diode such as the diode 8, 9 and 10 of FIG. 2 or to groups thereof one or more switch elements 12 may be connected. With the circuit shown in FIG. 2, $2^3-1=7$ different ways are possible of short circuiting one or more of the diodes 8, 9 and 10. With a suitable choice of the zener voltages of the diodes 8, 9 and 1 this can result in $2^3=8$ different voltages between the connecting terminals 5 and 6. Preferably the zener voltages of the diodes 8, 9 and 10 differ mutually by a factor of 2. Instead of a zener diode 8, 9 and 10 a series circuit of one or more normal diodes and/or light-emitting diodes may be used.

Instead of normally open switch elements 12 as shown, one or more normally closed switch elements may be used.

As shown below, the main unit 3 is equipped for delivering independently of the operating state, a current with one or two different values. These two different current intensities and the resistor 11 are chosen in a manner such that the light-emitting diode 7 lights up in a manner difficult to observe at one current intensity and in a clearly detectable manner at the other current intensity and that the diode 7 is not overloaded at the high current intensity.

Figure 3:
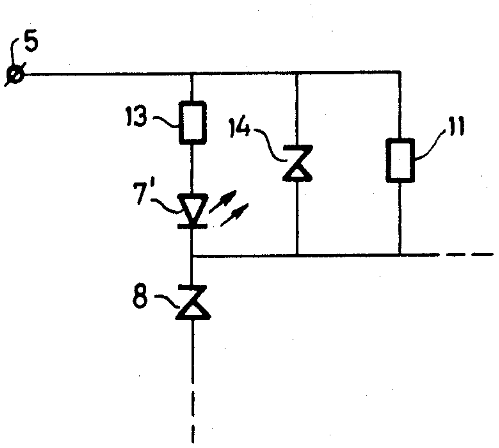
FIG. 3 shows a diagram of another embodiment of the signalling section of the operating unit of FIG. 2.

In order to reduce the influence of the voltage differences occurring at different current intensities across the light-emitting diode 7, the said diode may be replaced as shown in FIG. 3 by a series circuit of a light-emitting diode 7' and a resistor 13, a zener diode 14 being connected in parallel to the resistor 11.

Figure 4:
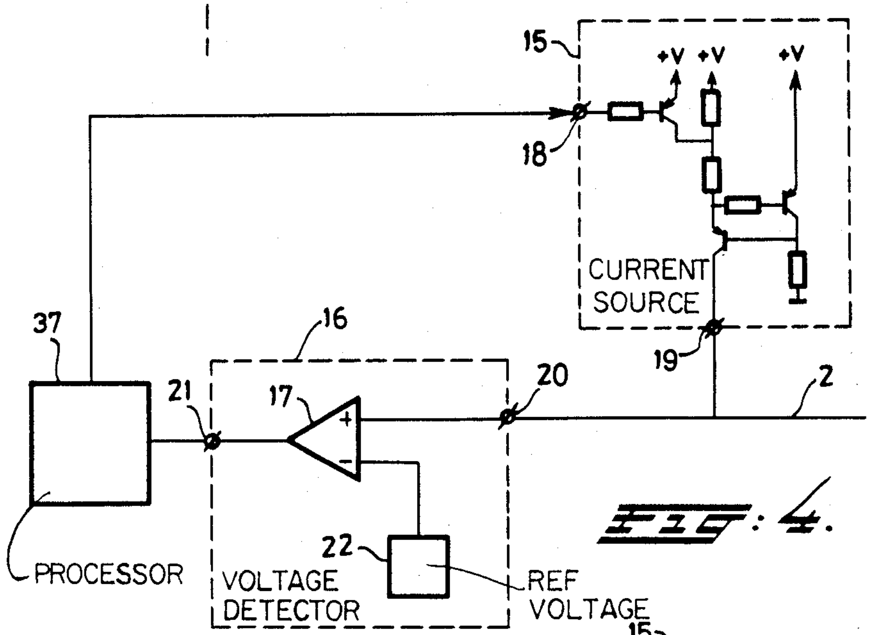
FIG. 4 shows a diagram of a first embodiment of the main unit of FIG. 1.

The diagram of a main unit 3 from FIG. 1 shown in FIG. 4 comprises a current source circuit 15, a voltage detection circuit 16 and a processing circuit 37.

The current source circuit 15 has a control input 18 which is connected to the processing circuit 37 and an output 19 which is connected to the pair of conductors 2 connnected to an operating unit 1. Of this pair the other connector, which may be connected to electrical earth, is not shown.

Because the current source circuit 15 does not form a subject of the invention, detailed discussion thereof will be omitted here.

If the input 18 of the current source circuit 15 receives a voltage with a low level, the current source circuit 15 will deliver a current with a high value to the conductor pair 2. If the input 18 receives a voltage with a high level, the current source circuit 15 will deliver a current with a low value to the conductor pair 2.

The voltage detection circuit 16 has an input 20 which is connected to an operating unit 1. In the embodiment of the main unit 3 according to FIG. 4 the output 19 of the current source circuit 15 and the input 20 of the voltage detection circuit 16 are therefore connected to each other.

An output 21 of the voltage detection circuit 16 is connected to a control input of the processing circuit 37.

The voltage detection circuit comprises a voltage comparator 17, a non-inverting input of which is connected to the input terminal 20 of the voltage detection circuit 16 and an inverting input of which is connected to an output of reference voltage source 22.

If an operating unit 1 as shown in FIG. 2 is used, the voltage between the connecting terminals 5 and 6 thereof will decrease if one or more of the switch elements 12 is closed. The output voltage of the comparator 17 may as a result fall below the voltage delivered by the voltage source 22, as a result of which the output voltage of the comparator 17 will go from high to low, which is detected by the processing circuit 37. If the processing circuit 37 detects a change in the value of the voltage at the output 21 of the voltage detection circuit 16, it delivers, depending on a fixed setting/programming thereof, a control signal with a different level to the control input 18 of the current source circuit 15. The setting of the processing circuit 37 may be such that the input 18 receives a voltage with a low level if the voltage at the output 21 has a low level with the result that the output 19 of the current source circuit 15 delivers a current with a high value, as a result of which the diode 7, convertor 23 for an analogue output signal is connected to an input of a sampling/hold circuit 25, an output of which is connected to the inverting input of the comparator 17. A control input of the sampling/hold circuit 25 is connected via a terminal 26 of the detection circuit 16' to the processing circuit 37'. The level of the analogue output signal of the convertor 23 has a value appropriate to the value of the digital input signal of the convertor 23. If the control signal fed via the connecting terminal 26 to the sampling/hold circuit 25 has a certain value, a sample of the analogue output signal of the convertor 23 is accepted by the sampling/hold circuit 25 and retained therein. The output signal of the sampling/hold circuit 25 fed to the inverting input of the comparator 17 then forms a reference voltage signal.

By suitable sequential setting/programming of the processing circuit 37', in which a digital signal with a different value is always fed to the convertor 23, any desired reference voltage can be fed to the inverting input of the comparator 17.

Figure 5:
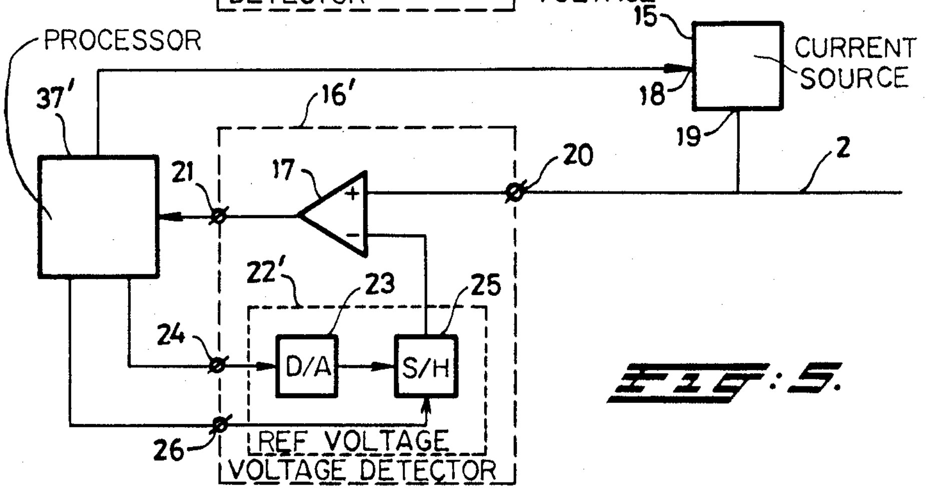
FIG. 5 shows a diagram of another embodiment of the main unit of FIG. 1.

The embodiment of the voltage detection circuit according to FIG. 5 is also suitable for matching the reference voltages to be applied sequentially to the inverting input of the comparator 17 to the characteristics of the diodes of a certain operating unit 1. The main unit 3 can then measure the actual voltage at the input 20 by means of the sequential comparison with different reference voltages and select and record for the measured voltage a reference voltage equal to it. A selected reference voltage may thereafter, as explained above, be used to detect the state of the respective operating unit 1.

Figure 6:
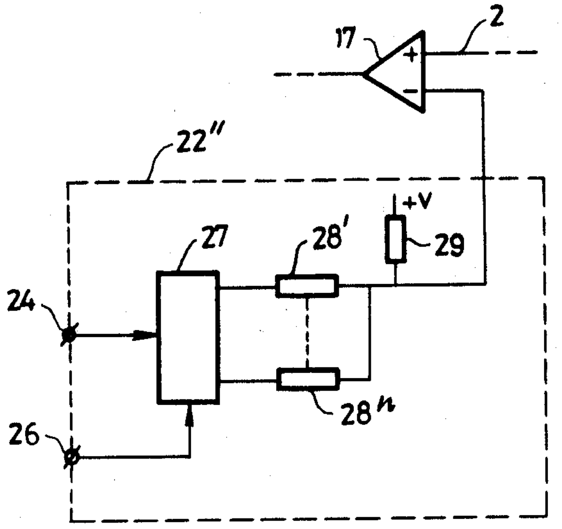
FIG. 6 shows a diagram of another embodiment of the voltage source circuit of the voltage detection circuit of FIG. 5.

FIG. 6 shows the diagram of a reference voltage source circuit 22", the operation of which corresponds to that of the reference voltage source circuit 22' of FIG. 5. The reference voltage source circuit 22" comprises a register 27, a serial or parallel input of which receives the digital signal from the connecting terminal 24. The register 27 receives a control signal from the connecting terminal 26 so that it can store the binary data received from the connecting terminal 24. The register 27 has a number n of outputs which correspond to the number of bits in the binary numerical value stored and which are each connected via a resistor $28^1 \ldots 28^n$ appropriate to the respective output to the inverting input of the voltage comparator 17. The inverting input of the comparator 17 is also connected via a resistor 29 to a reference voltage source which is not shown. In the example shown this reference voltage source delivers a positive voltage. The voltage source circuit 22" is simple and sufficiently accurate for the small number of diodes shown in FIG. 2. The accuracy of the circuit 22" is simple and sufficiently accurate for the small number of diodes shown in FIG. 2. The accuracy of the circuit 22" is also of subordinate importance because, as explained, the digital input signal fed to the terminal 24 can be determined by the processing circuit 37' as a function of previously received discrete voltages on the non-inverting input of the comparator 17.

Figure 7:
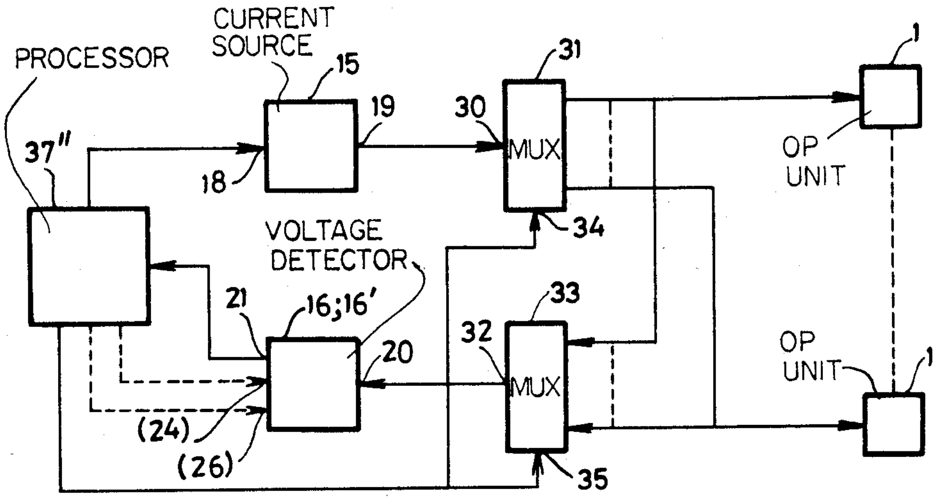
FIG. 7 shows a block diagram of another embodiment of the system according to the invention.

FIG. 7 shows a block diagram of a remote-control system according to the invention in which only one current source circuit 15 and only one voltage detection circuit 16 (or 16') is present. The current source circuit 15 and the voltage detection circuit 16 may have the embodiment explained above and are connected to the processing circuit, in FIG. 7, 37", in the manner explained above.

The output 19 of the current source circuit 15 is connected to an input 30 of a multiplexer 31 with a number of outputs which are each connected to a conductor of an associated conductor pair 2 connected to an operating unit 1. The other conductor of the pair 2 may be permanently connected to electrical earth or via another multiplexer not shown to a suitable connecting point of the current source circuit 15.

The input 20 of the voltage detection circuit 16 is connected to an output 32 of a multiplexer 33 with a number of inputs which are each connected to an output of the multiplexer 31 with the same sequence number. The multiplexers 31 and 33 have addressing inputs 34 and 35 respectively which are jointly connected to the processing circuit 37 for receiving addressing signals so that the outputs of the multiplexer 31 and the corresponding inputs of the multiplexer 33 are scanned in a sequence determine by the processing circuit 37". As a result of this each of the operating units 1 can be connected to the common current source circuit 15 and the common voltage detection circuit 16 of the system of FIG. 7.

The switch elements 12 are constructed in a manner such that, and/or the scanning of the multiplexer 31 and 33 is such that the processing circuit 37, 37', 37" will in a practical sense always be able to detect and process a change of position of a switch element 12.

In the event of rupture of one of the conductors of a pair of conductors 2 connected to an operating unit 1, or interruption of the series circuit of an operating unit 1, a relatively large current will flow through the input impedence of the comparator 17. Because the input impedence of the comparator 17, as is usual, is very high, the voltage detector 16 will detect a high voltage, the level of which is limited by the supply voltage of the voltage detector 16. By suitable choice of the number of diodes of an operating unit 1 and the voltage values of these diodes, it will be possible for the highest possible value of the input voltage of the voltage detector 16 to be interpreted by the processing circuit 17 as the occurrence of an interruption in the connection between the main unit 3 and the respective operating unit 1.

The processing circuit 37, 37', 37" of a main unit 3 can be equipped to receive a control voltage from another main unit 3 or from the central unit 4 for setting there with the setting means of the current source circuit of the first mentioned main unit 3. This possibility may for example, be used to send a message to a main unit 3, possible through the agency of the central unit 4, in order, for example, to seek "communication".

Finally it is noted that the current source circuit 15 for each of the embodiments explained of the main unit 3 may be equipped for delivering a pulse-type current, the pulse width of which is dependent on the control signal, fed to the control input 18, which is delivered by the processing circuit 37, 37', 37" and which may itself also be a pulse-type signal with a corresponding pulse width. In the last case the current source circuit 15 can be constructed very simply for delivering current or no current and by means of a suitable choice of the pulse width a desired construction of the signalling circuit can be obtained in a simple manner and light-emitting diodes in the latter can be replaced by other diodes with luminous efficiency characteristics which may be different.

What is claimed is:

1. Remote-control system comprising a main unit and, connected at a distance via a pair of conductors to the main unit, an operating unit which is provided with a series circuit of a number of diodes connected between the conductors and a number of switches which are each connected parallel to a group of one or more diodes, the main unit being provided with a supply circuit connected to the conductors and a voltage detection circuit connected to the conductors in a manner such that the voltage detection circuit generates a detection signal which is dependent on a state of the switches, wherein the supply circuit consists of a current source circuit which delivers to the conductor pair a current which is determined by a control signal delivered to a control input by a control circuit and the operating unit further including a signalling circuit which is connected to the series circuit of the diodes, the signalling circuit providing signalling which is dependent on the current through the series circuit.

2. Remote-control system according to claim 1, wherein the control circuit comprises a processing circuit, connected to the voltage detector, the processing circuit being responsive to the detection signal and delivering a control signal dependent on the detection signal to the control input of the current source circuit.

3. Remote-control system according to claim 1, wherein the current source circuit is responsive to the control signal, an amplitude of the current delivered by the current source circuit being determined in accordance with the control signal.

4. Remote-control system according to claim 1, wherein the current is pulse-type and the current source circuit is responsive to the control signal, a duration of the current pulses delivered by the current source circuit being determined in accordance with the control signal.

5. Remote-control system according to claim 1, wherein the signalling circuit comprises at least one light-emitting diode, which emits light having an intensity which is determined by the current through the series circuit.

6. Remote-control system according to claim 5, wherein parallel to the at least one light-emitting diode there is connected a zener diode, the diodes being connected with the anode of one connected to the cathode of the other.

7. Remote-control system according to claim 6, wherein a resistor is connected parallel to the light-emitting diode.

8. Remote-control system according to claim 5, wherein a resistor is connected parallel to the light-emitting diode.

9. Remote-control system according to claim 1, wherein a multiplexer is connected between the current source circuit and a number of conductor pairs of a corresponding number of operating units, the multiplexer being controlled by the control circuit in a manner such that the current delivered by the current source circuit is delivered to a conductor pair selected by the control circuit.

* * * * *